US009615412B2

(12) United States Patent
Rapisarda

(10) Patent No.: US 9,615,412 B2
(45) Date of Patent: Apr. 4, 2017

(54) MULTI-SEQUENCED LEDS ON TWO OR MORE WIRES

(71) Applicant: Carmen Rapisarda, Apple Valley, CA (US)

(72) Inventor: Carmen Rapisarda, Apple Valley, CA (US)

(*) Notice: Subject to any disclaimer, the term of this patent is extended or adjusted under 35 U.S.C. 154(b) by 0 days.

(21) Appl. No.: 14/199,689

(22) Filed: Mar. 6, 2014

(65) Prior Publication Data

US 2014/0254146 A1   Sep. 11, 2014

Related U.S. Application Data

(60) Provisional application No. 61/776,704, filed on Mar. 11, 2013, provisional application No. 61/807,294, filed on Apr. 1, 2013, provisional application No. 61/807,719, filed on Apr. 2, 2013, provisional application No. 61/824,557, filed on May 17, 2013.

(51) Int. Cl.
| | |
|---|---|
| *H05B 37/00* | (2006.01) |
| *H05B 33/08* | (2006.01) |
| *H01L 25/075* | (2006.01) |
| *F21Y 101/00* | (2016.01) |

(52) U.S. Cl.
CPC ..... *H05B 33/0803* (2013.01); *H05B 33/0842* (2013.01); *F21Y 2101/00* (2013.01); *H01L 25/0753* (2013.01); *H01L 2924/0002* (2013.01)

(58) Field of Classification Search
CPC .............................................. F21Y 2113/005
USPC ........ 315/185 R, 191, 193, 192, 200 A, 246; 362/800, 806
See application file for complete search history.

(56) References Cited

U.S. PATENT DOCUMENTS

| | | | | |
|---|---|---|---|---|
| 6,069,452 | A * | 5/2000 | Rossner | 315/192 |
| 7,589,350 | B2 * | 9/2009 | Chen | H01L 27/15 257/79 |
| 8,410,708 | B2 * | 4/2013 | Hsu | F21S 4/001 315/185 S |
| 2008/0116816 | A1 * | 5/2008 | Neuman et al. | 315/185 S |
| 2008/0203936 | A1 * | 8/2008 | Mariyama et al. | 315/246 |
| 2009/0160370 | A1 * | 6/2009 | Tai et al. | 315/312 |
| 2011/0260633 | A1 * | 10/2011 | Takeda et al. | 315/192 |
| 2012/0032589 | A1 * | 2/2012 | Lai | 315/35 |

(Continued)

OTHER PUBLICATIONS

International Search Report for International Application No. PCT/US2014/022388.

(Continued)

*Primary Examiner* — Thuy Vinh Tran
(74) *Attorney, Agent, or Firm* — Roy L. Anderson

(57) ABSTRACT

The present invention is generally directed to sequencing two or more LEDs on two or more wires; if more than two wires are used, any two pairs of wires can be used as a pair of wires. Each pair of wires can be used to sequence two or more LEDs, and a sequencer can control sequencing of LEDs on multiple wires connected in a group, or in multiple groups of multiple wires. For a given pair of wires, a first group of LEDs is wired opposite a second group of LEDs so that only one group will emit light at one time depending upon the flow of an alternating current. Two groups of LEDs can also be created by using two different semiconductor materials alternately wired to a single anode and cathode pair of a single LED physical package.

9 Claims, 3 Drawing Sheets

(56) References Cited

U.S. PATENT DOCUMENTS

2012/0146505 A1 6/2012 Jonsson
2013/0009560 A1 1/2013 Takeda et al.

OTHER PUBLICATIONS

Written Opinion of the International Searching Authority for PCT/2014/022388.

* cited by examiner

MULTI-SEQUENCED LEDS ON TWO OR MORE WIRES

CROSS REFERENCE TO RELATED APPLICATIONS

This application is a non-provisional application that claims priority from each of the following provisional applications, all of which are specifically incorporated herein by reference: U.S. Ser. No. 61/776,704, filed Mar. 11, 2013; U.S. Ser. No. 61/807,294, filed Apr. 1, 2013; U.S. Ser. No. 61/807,719, filed Apr. 2, 2013; and U.S. Ser. No. 61/824,557, filed May 17, 2013.

FIELD OF THE INVENTION

The present invention is in the field of light-emitting diodes affixed to two or more conductive wires.

BACKGROUND OF THE INVENTION

LEDs typically have two lead wires: a positive or anode lead, and a negative or cathode lead. Such LEDs produce light when current flows through the LED. LEDs can produce different colors depending upon the way they are manufactured, but a given LED will not produce different colors with only two wires. Inside an LED, a semiconductor material or chip is wire bonded to each of the two lead wires. Sometimes multiple LEDs can be contained within a single package, but they require more than two leads. An LED package typically has an epoxy lens/case which encapsulates and serves as a housing for the LED semiconductor chip

SUMMARY OF THE INVENTION

The present invention is generally directed to sequencing two or more LEDs on two or more wires; if more than two wires are used, any two pairs of wires can be used as a pair of wires—thus, for example, if three pairs of wires are used, there are three possible combinations of wire pairs (1+2; 1+3 and 2+3); if four pairs of wires are used, there are six possible combinations of wire pairs (1+2, 1+3, 1+4, 2+3, 2+4, 3+4); with the number of possible pairs of wires increasing with the number of wires. Each pair of wires can be used to sequence two or more LEDs, and a sequencer can control sequencing of LEDs on multiple wires connected in a group, or in multiple groups of multiple wires. For a given pair of wires, a first group of (one or more) LEDs has its anode electrically connected to a first wire in the wire pair and its cathode electrically connected to a second wire in the wire pair while a second group of (one or more) LEDs has its cathode electrically connected to the first wire and its anode electrically connected to the second wire so that either the first group or the second group of LEDs will emit light at one time, depending upon the flow of an alternating current of electricity, but both LEDs will not emit light at the same time. Because the current is alternated between the two groups of LEDs, the two groups can use different voltages so that two LEDs that operate at different voltages can be used on a single pair of wires. Two groups of LEDs can also be created by using two different semiconductor materials alternately wired to a single anode and cathode pair of a single two-pin LED; in such an LED, each semiconductor material can emit a different color of visible light and the sequencer can cause the current to alternate at a sufficiently high frequency that a human eye will perceive a third visible color which is a color addition of the two visible colors emitted from the two semiconductor materials. A designer can select the number of wires and sequencing of LEDs to create a chasing effect.

Accordingly, it is a primary object of the present invention to provide improved sequences of LEDs in two or more conductive wires.

This and further objects and advantages will be apparent to those skilled in the art in connection with the drawings and the detailed description of the preferred embodiment set forth below.

DETAILED DESCRIPTION OF THE INVENTION

In one aspect of the present invention, a power source 1, a switch 2 (e.g., a mechanism for detecting motion, a transducer and a controller for the transducer), a controller 3, and one or more strings of LEDs 4 are all electrically connected together.

Switch 2, in an especially preferred embodiment suitable for use in articles of manufacture in which lighting is a desired effect upon movement of such items, is a motion switch which detects motion of the article of manufacture, such as somebody walking when the article of manufacture is a shoe. Switch 2 can take any of many forms, the details of which are not important for the present invention. Thus, by way of illustration only, switch 2 can be made according to the teachings of U.S. Pat. No. RE37,220, the details of which are specifically incorporated herein by reference. The important function for motion switch 2 is to detect motion and then generate a signal that is received by controller 3.

Figure 1:
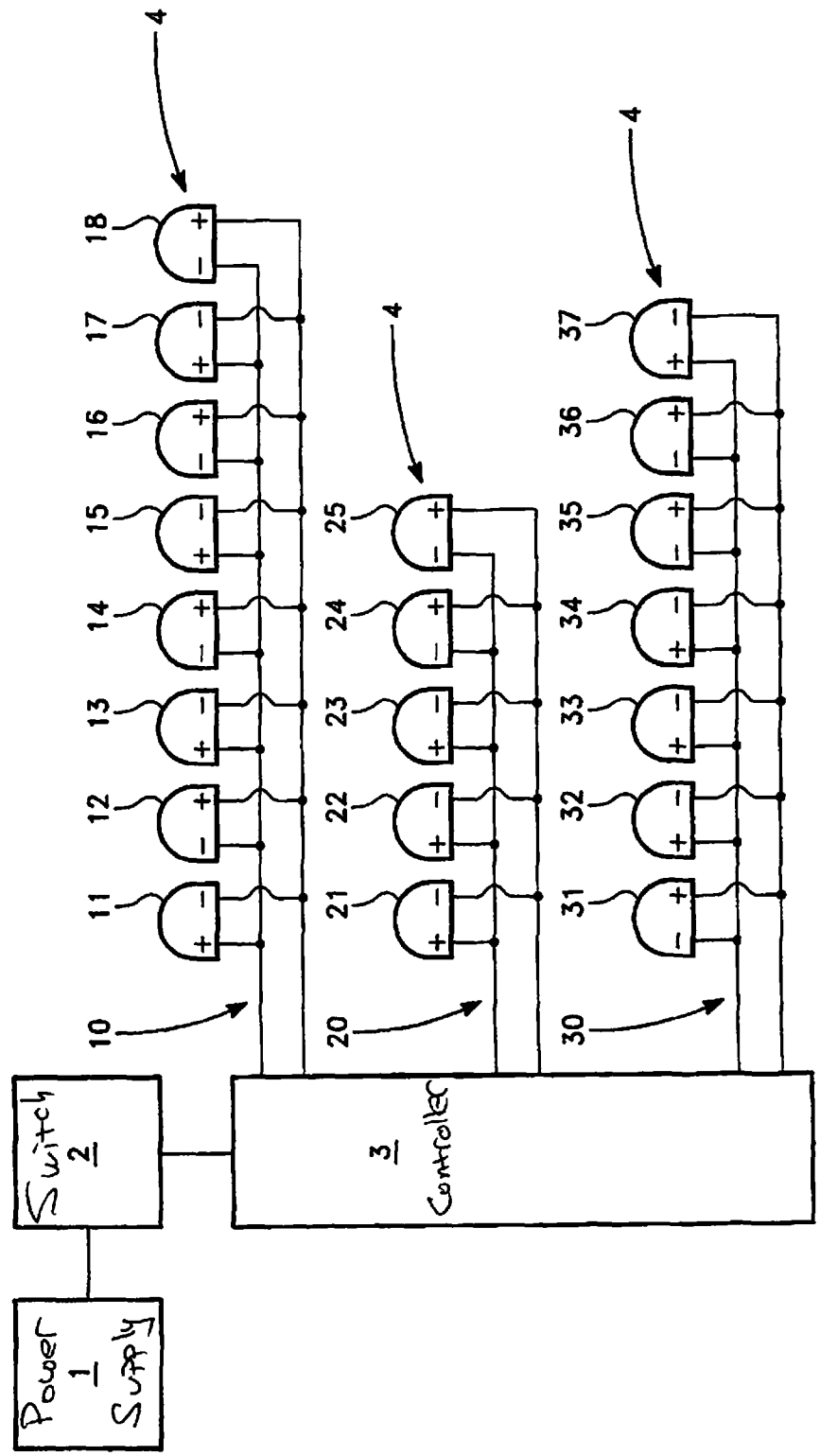
FIG. 1 is a conceptual schematic diagram of three strings of LEDs which are controlled by a controller in accordance with the present invention. The LEDs in this diagram all have two pins (a cathode and an anode) and only piece of semiconductor material that emits light.

Controller 3 can be a microprocessor, integrated circuit, ASIC chip or multiple electronic components, as long as the functions described hereinafter for the controller are performed. Controller 3 controls sequencing for one or more strings of LEDs, shown generally as 4, three of which are shown in FIG. 1 (10, 20, 30). The sequencing can be the same or different for each string, and the strings can be of the same or differing lengths of LEDs. (In FIG. 1, string 10 has eight LEDs, 11-18; string 20 has 5 LEDs, 21-25; and string 30 has 7 LEDs, 31-37.) Thus, the exact number of strings and LEDs on a given string are limited only by designer choice, although there should be at least two LEDs on each string that is to utilize the advantages of the present invention.

Each LED attached to each string of LEDs is attached in parallel, and each LED has two leads, one to a line designated positive, the other to a line designated negative. LEDs are traditionally run off of direct current and they must be correctly wired to properly function; in this sense, LEDs function like a diode, with correct functioning only occurring when their leads are properly connected to the direct power lines. By contrast, in the present invention, some of the LEDs in a string of LEDs are purposely reversed so that they will not light when direct current is pulsed or applied to the string of LEDs. Accordingly, the present invention separates the LEDs in a string into two groups: a first group that is correctly wired to light with direct current and a second group that is wired so that it will not light with the same direct current that causes the first group of LEDs to light, but which will light when the current is alternated by controller 3. When controller 3 alternates the current, it effectively turns on the second group of LEDs, while the first group of LEDs will no longer be turned on. Thus, in summary, controller 3, by generating alternating current in the one or more strings of LEDs, controls which of two groups of LEDs will be turned on at a given instant. And, of course, controller 3 can control how often either group of LEDs is turned on, or flashed, and how often.

To illustrate the present invention further, and by way of example and illustration only, the three strings of LEDs depicted in FIG. 1 are wired so that the following LEDs will light with a pulse of direct current—in string 10, LEDs 11, 13, and 17; in string 20, LEDs 21-23; and in string 30, LEDs 32-34 and 37—while the remaining LEDs—in string 10, LEDs 12, 14, 16 and 18; in string 20, LEDs 24 and 25; in string 30, LEDs 31, 35 and 36—will not light with the pulse of direct current, but will light when the current is alternated.

Controller 3 can control how often any group of LEDs is turned on, or flashed, and how often and for how long. Accordingly, as will be readily apparent to one skilled in the art, this embodiment provides a novel way of separating a plurality of LEDs in a parallel string into two groups of LEDs, only one of which can be lit at a given moment. This flexibility, when coupled with flexibility in timing of pulses, and choosing which lights are included within each group in a given parallel string of lights, adds enormous new flexibility to designers wishing to create eye-catching displays of pulsed LEDs, especially when such pulsing is controlled or actuated by motion.

Figure 2:
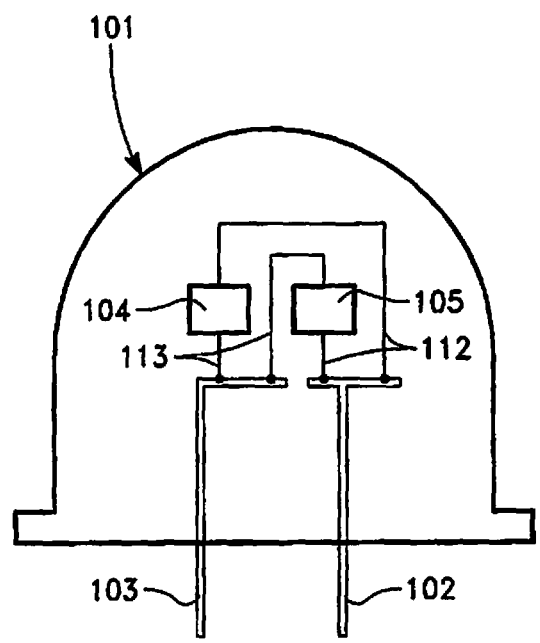
FIG. 2 illustrates a two-pin LED that has two pairs of semiconductor material that emit light so that the single two-pin device can function as a pair of LEDs in accordance with the present invention while FIG. 3 conceptually illustrates two such LEDs controlled by a sequencer which effectively turns on only one of two semiconductor chips contained in each LED which is mounted in a parallel string.

FIG. 2 illustrates a multi-color LED 101 that can be used in another aspect of the present invention. LED 101 has a positive or anode lead 102 and a negative or cathode lead 103. Two different semiconductor chips, 104 and 105, are assembled into LED 101, such as by mounting them on a cup or anvil of either the anode lead 102 or the cathode lead 103. Each of the two different semiconductor chips 104 and 105 emits a different color of light. For example, semiconductor chip 104 might emit a green color while semiconductor chip 105 might emit a red color (at least as perceived by a human eye). Each of the two different semiconductor chips 104 and 105 is wire bonded to lead 102 by wire bonding 112 and to lead 103 by wire bonding 113, although they are wire bonded so as to only function with opposite polarity so that only one of them will emit light with a negative current while the other will emit light with a positive current. In this same example, if the current is alternated at a high enough frequency, the human eye will perceive the light emitted from LED 101 as a third color which represents the color addition of the two lights, such as yellow in this example. Thus, a single two pin LED 101 can be made to emit three different colors, depending upon how the power source for LED 101 is driven.

Figure 3:
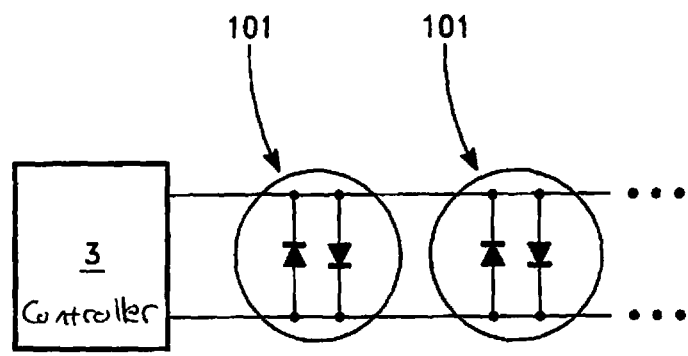

One semiconductor chip of LED 101 is purposely reversed so that it will not emit light when direct current is pulsed or applied to LED 101. Accordingly, the present embodiment separates the two different semiconductor chips 104 and 105 of LED 100 into two categories: a first category that is correctly wired to light with direct current and a second category that is wired so that it will not light with the same direct current that causes the first category of semiconductor chip to light, but which will light when the current is alternated by a controller 3. When a controller alternates the current, it effectively turns on the second category of semiconductor chip, while the first category of semiconductor chip will no longer be turned on, and this will also be the case when multiple LEDs 100 are connected in parallel strings as shown in FIG. 3. Thus, in summary, controller 3, by generating alternating current for either a single LED 101 or for one or more strings of LEDs 101, controls which of two groups of semiconductor chips will be turned on at a given instant. And, of course, controller 3 can control how often either group of semiconductor chip is turned on, or flashed, and how often, and for how long, which is how a third additive color can also be generated by a single two-pin LED 101.

Use of controller 3 allows a designer another choice not presently available. At the present time it is known that some colored LEDs work at a different voltage than other LEDs, so it has come to be recognized that some such LEDs are in a class of low voltage LEDs while other LEDs are in a class of high voltage. When multiple LEDs are used in parallel in a single string of two wires, it is not presently possible to successfully mix low and high voltage LEDs in the same string, so such strings are typically limited to either low or high voltage LEDs. However, in accordance with the present invention, it is now possible to mix such low and high voltage LEDs on a single string of two wires. This can be done by making one of the two different semiconductor chips 104 and 105 low voltage and the other a high voltage, and then using this convention for the whole string. What this means is that all of the low voltage LEDs can be run at one time while all of the high voltage LEDs can be run at a different time, and controller 3 can cause the voltage to vary, in addition to changing polarity of the current, to alternately light a string of low voltage semiconductor chips or a string of high voltage semiconductor chips, with the string being the same string of LEDs. It is also possible to use LEDs that do not have two semiconductor chips in the same string of lights, or make strings of lights that either light a high or low voltage LED or do not light. In such arrangements an LED with a single semiconductor chip will either work or not, depending upon whether the alternating current either does or does not turn the LED on.

The above disclosure provides a designer with a variety of ways to incorporate new LED sequencing possibilities into a string of two conductive wires, at various locations, in ways that can be customized or personalized. Strings of multi-color LEDs 101 can be mixed with strings of LEDs 4 and controller 3 can alternate the current to different strings at different frequencies and for different durations from each other.

So far the present invention has been described in terms of how pairs of conductive wires can be used to create two different groups of LEDs that are actuated by an alternating current. The addition of one or more additional conductive wires will increase the number of groups of LEDs that can function in different states at different times because each group of two wires can support its own pair of two groups of LEDs, with controller 3 selecting both the wires through which current will flow as well as the direction (or polarity) of the current through the selected pair of wires. For example, FIG. 4 illustrates how additional groups of LEDs can be created by adding a third or a fourth conductive wire, and the same patterns, or different patterns could be added to the ends of the physical strings of LEDs shown in FIG. 4.

Figure 4:
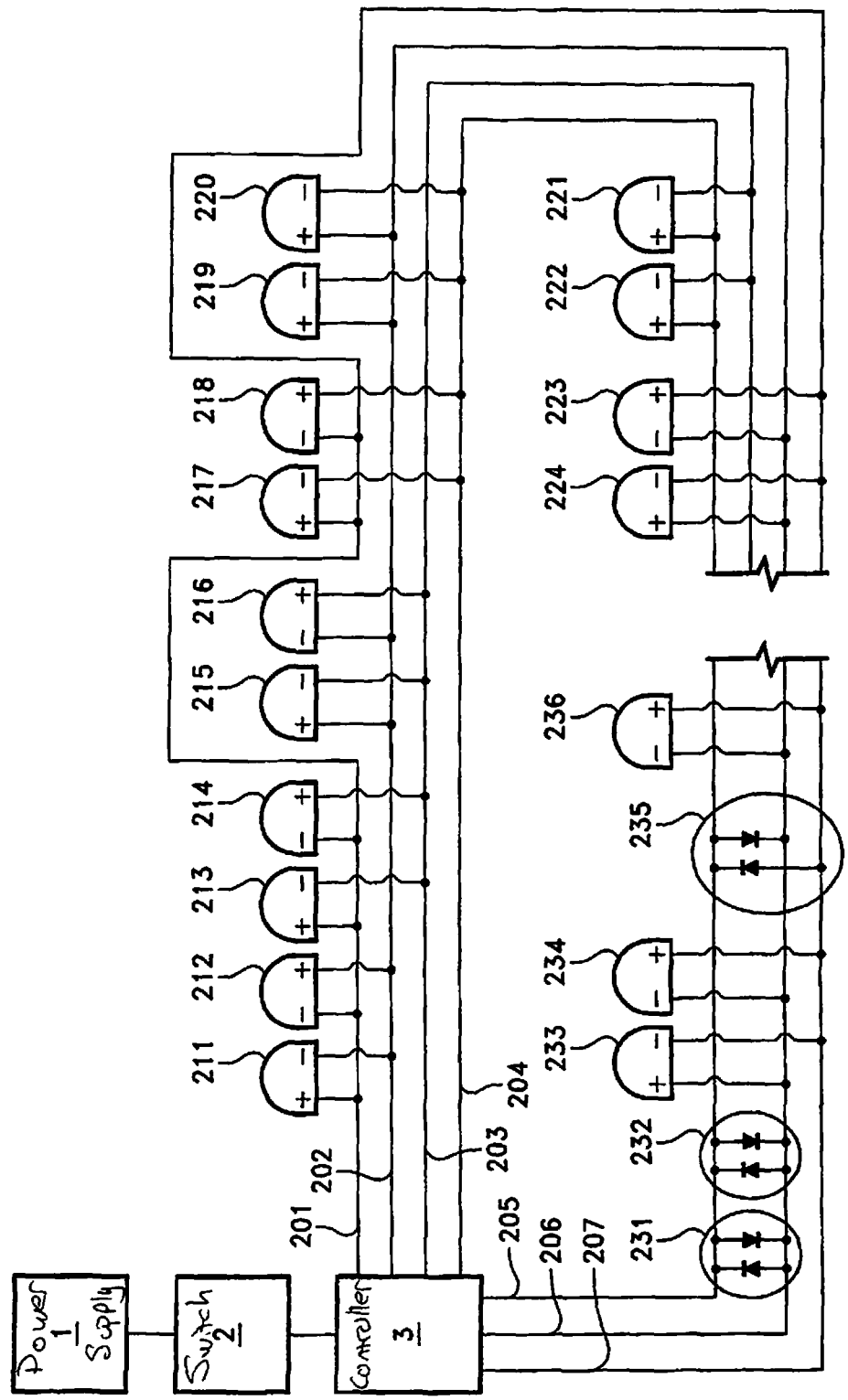
FIG. 4 is a conceptual schematic diagram of two separate groupings of three or more wires that contains pairs of LEDs arranged in accordance with the present invention.

In FIG. 4 three conductive wires 205-207 are illustrated using a combination of LEDs with a single semiconductor material in which their placement is reversed (LEDs 233, 234 and 236) and LEDs with two conductive materials that can emit multiple colors of lights (LEDs 231, 232 and 235).

The inclusion of four conductive wires 201-204 to create a chasing effect is also shown in FIG. 4 which illustrates the creation of six groups of LEDs—211 and 212; 213 and 214; 215 and 216; 217 and 218; 219 and 220; 221 and 222. A chasing effect is created when a series of LEDs in a physical sequence (note that the LEDs are electrically connected in parallel, not in series) are actuated in such a manner as to create a perceived movement of light as one LED is lit and then goes dark while the next LED in the physical series is lit then goes dark and this pattern is repeated down the physical series of LEDs, so that the sequence of light emitted from the physical series of lights appears to be chasing or running down the physical series. Accordingly, in this example, if the desired chasing effect uses the maximum sequence of six, controller can first select conductive wires 201 and 202 and alternately flow current through these wires to light LEDs 211 and 212, then it select conductive wires 201 and 203 and alternately flow current through these wires to light LEDs 213 and 214, then select conductive wires 202 and 203 and alternately flow current through these wires to light LEDs 215 and 216, then select conductive wires 201 and 204 and alternately flow current through these wires to light LEDs 217 and 218, then select conductive wires 202 and 204 and alternately flow current through these wires to light LEDs 219 and 220, then select conductive wires 203 and 204 and alternately flow current through these wires to light LEDs 221 and 222.

It is worth noting that a chasing effect is but one of many lighting effects that can be created by a designer using the teachings of the present invention. As should be readily apparent to a person skilled in the art, armed with the present disclosure, a designer can chose the number of conductive wires to include a group of such wires, how many groups of wires to include in any electrical circuit or lighting module using such groups of wires, how many groups of LEDs are desired, the number of LEDs to include in any given group of LEDs or group of conductive wires, the types of LEDs to be included (whether high or low voltage, or multi-colored LEDs with two semiconductor materials), and the sequencing chosen for all such components. In other words, the present invention enables a plethora of designer choices never before seen, nor contemplated.

Although the foregoing detailed description is illustrative of preferred embodiments of the present invention, it is to be understood that additional embodiments thereof will be obvious to those skilled in the art. Further modifications are also possible in alternative embodiments without departing from the inventive concept.

Accordingly, it will be readily apparent to those skilled in the art that still further changes and modifications in the actual concepts described herein can readily be made without departing from the spirit and scope of the disclosed inventions.

What is claimed is:
1. An apparatus, comprising:
a first electrically conductive wire;
a second electrically conductive wire;
a first plurality of light emitting diodes ("LEDs"), each of which is comprised of a first semiconductor material having both a negative lead contact and a positive lead contact, wherein each of the first plurality of LEDs has its negative lead contact electrically connected to the first electrically conductive wire and its positive lead contact electrically connected to the second electrically conductive wire;
a second plurality of light emitting diodes ("LEDs"), each of which is comprised of a second semiconductor material having both a negative lead contact and a positive lead contact, wherein each of the second plurality of LEDs has its negative lead contact electrically connected to the second electrically conductive wire and its positive lead contact electrically connected to the first electrically conductive wire;
a controller that alternates the flow of a current through the first electrically conductive wire and the second electrically conductive wire between a first state and a second state;
a third electrically conductive wire;
a third plurality of light emitting diodes ("LEDs"), each of which is comprised of a third semiconductor material having both a negative lead contact and a positive lead contact, wherein each of the third plurality of LEDs has its negative lead contact electrically connected to the third electrically conductive wire and its positive lead contact electrically connected to either the first electrically conductive wire or the second electrically conductive wire; and
a fourth plurality of light emitting diodes ("LEDs"), each of which is comprised of a fourth semiconductor material having both a negative lead contact and a positive lead contact, wherein each of the fourth plurality of LEDs has its positive lead contact electrically connected to the third electrically conductive wire and its negative lead contact electrically connected to either the first electrically conductive wire or the second electrically conductive wire;
wherein the first semiconductor material in each of the second plurality of LEDs is actuated to emit light in the first state with a direct current but not in the second state with an alternated current while the second semiconductor material in each of the first plurality of LEDs is actuated to emit light in the second state but not in the first state; and
wherein every LED in the first and the second plurality of LEDs are electrically connected to the first and the second electrically conductive wires in parallel to form a string of LEDs.

2. The apparatus of claim 1, wherein the controller alternates the flow of a second current through the third electrically conductive wire and either the first electrically conductive wire or the second electrically conductive wire between a third state and a fourth state; and
wherein the third semiconductor material in each of the third plurality of LEDs is actuated to emit light in the third state with a second direct current but not in the fourth state with a second alternated current while the fourth semiconductor material in each of the fourth plurality of LEDs is actuated to emit light in the fourth state but not in the third state.

3. The apparatus of claim 2, wherein the first, second, third, and fourth groups are arranged in a sequence to create a chasing effect when the controller alternates the flow of current through the first, second, third, and fourth states.

4. The apparatus of claim 2, further comprising:
a fourth electrically conductive wire;
a fifth plurality of LEDs, each of which is comprised of a fifth semiconductor material having both a negative lead contact and a positive lead contact, wherein each of the fifth plurality of LEDs has its negative lead contact electrically connected to the fourth electrically conductive wire and its positive lead contact electrically connected to one of a group of wires consisting of the first, the second, and the third electrically conductive wires; and
a sixth plurality of LED, each of which is comprised of a sixth semiconductor material having both a negative lead contact and a positive lead contact, wherein each of the sixth plurality of LEDs has its positive lead contact electrically connected to the fourth electrically conductive wire and its negative lead contact electrically connected to one of the group of wires.

5. The apparatus of claim 4, wherein the controller alternates the flow of a third current through the fourth electrically conductive wire and one of the group consisting of the first, second and third electrically conductive wires between a fifth state and a sixth state; and
wherein the fifth semiconductor material in each of the fifth plurality of LEDs is actuated to emit light in the fifth state but not in the sixth state while the sixth semiconductor material in each of the sixth plurality of LEDs is actuated to emit light in the sixth state but not in the fifth state.

6. The apparatus of claim 5, wherein the first, second, third, fourth, fifth and sixth plurality of LEDs are arranged in a sequence to create a chasing effect when the controller alternates the flow of current through the first, second, third, fourth, fifth, and sixth states.

7. An electrical circuit, comprising:
a first electrically conductive wire;
a second electrically conductive wire;
at least one additional electrically conductive wire;
a first group of one or more light emitting diodes ("LEDs"), each of which is comprised of a first semiconductor material having both a negative lead contact and a positive lead contact, wherein each of the first group of one or more LEDs has its negative lead contact electrically connected to the first electrically conductive wire and its positive lead contact electrically connected to the second electrically conductive wire;
a second group of one or more LEDs, each of which is comprised of a second semiconductor material having both a negative lead contact and a positive lead contact, wherein each of the second group of one or more LEDs has its positive lead contact electrically connected to the first electrically conductive wire and its negative lead contact electrically connected to the second electrically conductive wire;
a third group of one or more LEDs, each of which is comprised of a third semiconductor material having both a negative lead contact and a positive lead contact, wherein each of the third group of one or more LEDs has its negative lead contact electrically connected to a third electrically conductive wire from the at least one additional electrically conductive wire and its positive lead contact electrically connected to either the first electrically conductive wire or the second electrically conductive wire; and
a fourth group of one or more LEDs, each of which is comprised of a fourth semiconductor material having both a negative lead contact and a positive lead contact, wherein each of the fourth group of one or more LEDs has its positive lead contact electrically connected to the third electrically conductive wire and its negative lead contact electrically connected to either the first electrically conductive wire or the second electrically conductive wire;
a power source; and
a controller that alternates the flow of a current through the first electrically conductive wire and the second electrically conductive wire between a first state and a second state;
wherein the first semiconductor material in each of the first group of one or more LEDs is actuated to emit light in the first state but not in the second state while the second semiconductor material in each of the second group of one or more LEDs is actuated to emit light in the second state but not in the first state; and
wherein every LED in the first and the second groups of one or more LEDs are electrically connected to the first and the second electrically conductive wires in parallel to form a string of LEDs.

8. The electrical circuit of claim 7, wherein the controller alternates the flow of current through the third electrically conductive wire and one of the group consisting of the first electrically conductive wire, the second electrically conductive wire and one of the at least one additional electrically conductive wire other than the third electrically conductive wire between a third state and a fourth state; and
wherein the third semiconductor material in each of the third group is actuated to emit light in the third state but not in the fourth state while the fourth semiconductor in the fourth group is actuated to emit light in the fourth state but not in the third state.

9. The electrical circuit of claim 8, wherein the controller alternates the flow of current between a pair of electrically conductive wires selected from the group consisting of the first electrically conductive wire, the second electrically conductive wire and a chosen wire of the at least one additional electrically conductive wire to create a chasing effect.

* * * * *